(12) United States Patent
Reber et al.

(10) Patent No.: US 9,041,209 B2
(45) Date of Patent: May 26, 2015

(54) METHOD AND APPARATUS TO IMPROVE RELIABILITY OF VIAS

(75) Inventors: Douglas M. Reber, Austin, TX (US); Lawrence N. Herr, Coupland, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/299,566

(22) Filed: Nov. 18, 2011

(65) Prior Publication Data

US 2013/0127064 A1    May 23, 2013

(51) Int. Cl.
*H01L 23/498*    (2006.01)
*G06F 17/50*    (2006.01)
*H01L 21/768*   (2006.01)

(52) U.S. Cl.
CPC ...... *G06F 17/5068* (2013.01); *H01L 21/76814* (2013.01); *H01L 21/76828* (2013.01)

(58) Field of Classification Search
USPC ............ 257/774, 750, 620, E21.53, E23.067, 257/E21.521
See application file for complete search history.

(56) References Cited

U.S. PATENT DOCUMENTS

| | | | |
|---|---|---|---|
| 6,093,631 A * | 7/2000 | Jaso et al. | 438/618 |
| 6,436,850 B1 * | 8/2002 | Morales | 438/781 |
| 6,459,156 B1 * | 10/2002 | Travis et al. | 257/774 |
| 6,797,633 B2 | 9/2004 | Jiang et al. | |
| 6,905,967 B1 * | 6/2005 | Tian et al. | 438/697 |
| 7,476,602 B2 | 1/2009 | Ajmera et al. | |
| 7,564,136 B2 | 7/2009 | Yeh et al. | |
| 2007/0098247 A1 * | 5/2007 | Sanderson et al. | 382/145 |
| 2007/0262454 A1 * | 11/2007 | Shibata | 257/758 |
| 2010/0242008 A1 * | 9/2010 | Liu et al. | 716/6 |
| 2012/0217646 A1 | 8/2012 | Hoang et al. | |
| 2013/0134595 A1 | 5/2013 | Reber | |

OTHER PUBLICATIONS

U.S. Appl. No. 13/114,100 filed May 24, 2011.
Fujimaki et al.; "Mechanism of Moisture Uptake Induced Via Failure and its Impact on 45nm Node Interconnect Design"; Electron Devices Meeting 2005, IEDM Technical Digest; Dec. 5, 2005; pp. 183-186.; IEEE.

* cited by examiner

*Primary Examiner* — Chuong A Luu
*Assistant Examiner* — Rodolfo Fortich

(57) ABSTRACT

In a disclosed embodiment, a method for tiling selected vias in a semiconductor device having a plurality of vias comprises generating a layout database for the semiconductor device; creating zones around the plurality of vias; measuring density of covering metal in each zone; selecting a low density zone as being a zone that has a metal density less than a threshold metal density; and adding at least one tiling feature on a metal layer above the plurality of vias in the low density zone so that metal density of the low density zone increases to at least the same as the threshold metal density.

14 Claims, 3 Drawing Sheets

METHOD AND APPARATUS TO IMPROVE RELIABILITY OF VIAS

BACKGROUND

1. Field

This disclosure relates generally to semiconductor processing, and more particularly, to improving reliability of vias.

2. Related Art

Integrated circuits are formed with metal layers stacked on top of one another and dielectric layers between the metal layers to insulate the metal layers from each other. Normally, each metal layer has an electrical contact to at least one other metal layer. Electrical contact can be formed by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with a conductive material, provides an electrical connection through the dielectric layer to a conductive layer underlying the dielectric layer.

With the number of transistors that are now present on integrated circuits, the number of vias can exceed a billion and there can be ten or more different conductive layers. Even if each via is highly reliable, there are so many vias that it is likely for there to be at least one via failure. Low-k BEOL (Back-End of Line) interlayer dielectrics commonly used in advanced technology integrated circuit manufacturing can have trapped moisture and hydroxyl ions. These trapped water species pose a risk of oxidizing via barrier material if not sufficiently out-gassed. Vias with oxidized tantalum barriers exhibit excessive via resistance that has been shown to cause timing delays in semiconductor devices. A barrier material is used to contain the migration of a copper used for a metal layer through the insulating material.

Barrier materials typically used today are a combination of tantalum and tantalum nitride, or just tantalum. Tantalum nitride has good adhesion properties to the oxide dielectric. However, other materials can be used. One problem which is specifically worse for tantalum is that tantalum oxidizes to form tantalum pentoxide and expands to a volume which is several times larger than just the tantalum. Also, the tantalum pentoxide is an insulator and has very high resistance.

Accordingly, it is desirable to provide a technique for improving the reliability of vias and uniformity of via resistance.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices are disclosed herein that improve reliability of vias and/or improve uniformity of via resistance by adding tiling features around the vias to improve moisture dissipation during out-gassing processes. In one embodiment, vias located in zones which have a covering metal density of less than a predetermined density are identified, and tiling features are added around these identified vias. This is better understood by reference to the following description and the drawings.

Figure 1:
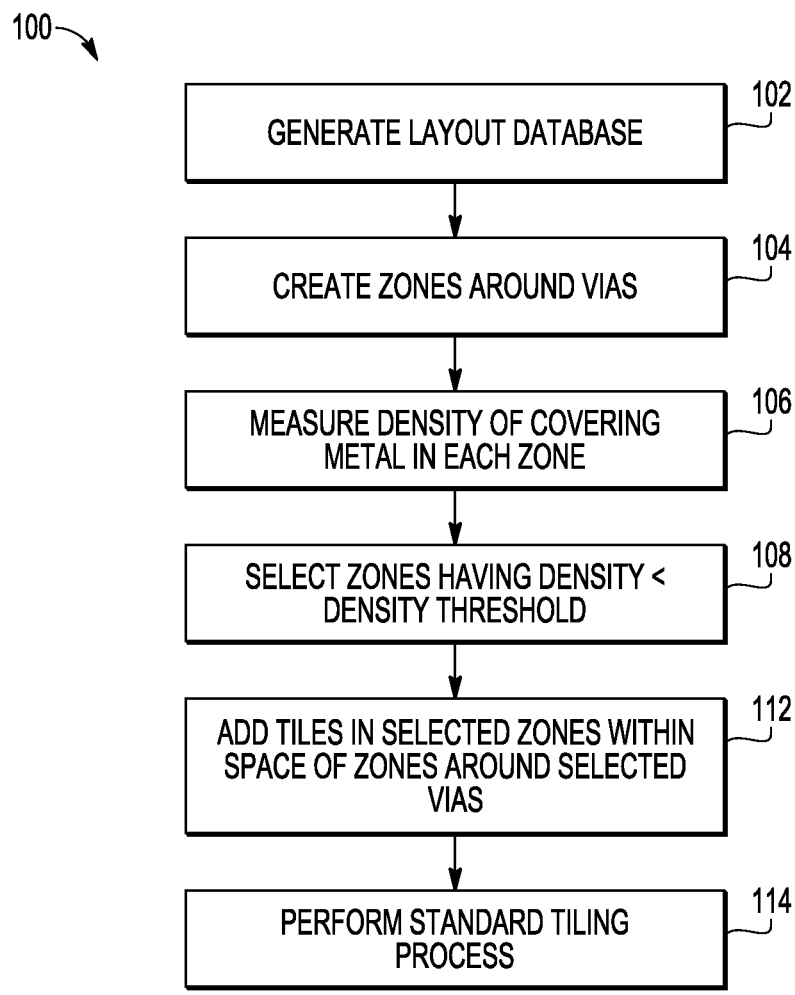
FIG. 1 is a flow diagram of an embodiment of a process for determining where to add metal tiles around one or more vias to improve reliability of a semiconductor device.

FIG. 1 is a flow diagram of an embodiment of process 100 for determining where to add metal tiles around one or more vias to improve reliability of a semiconductor device or integrated circuit. Process 102 includes generating a layout database for the semiconductor device that includes the type, size, location and interconnections between features or components such as metal layers, dielectric layers, and vias connecting the conductive layers in the semiconductor device. Any suitable type of integrated circuit design tool can be used in process 102. One example of a commercially available tool that can be used is the IC Station design system by Mentor Graphics, Inc. of Wilsonville, Oreg. An additional tool called Calibre by Mentor Graphics can be used to manipulate a database for an IC designed using IC Station.

Figure 2:
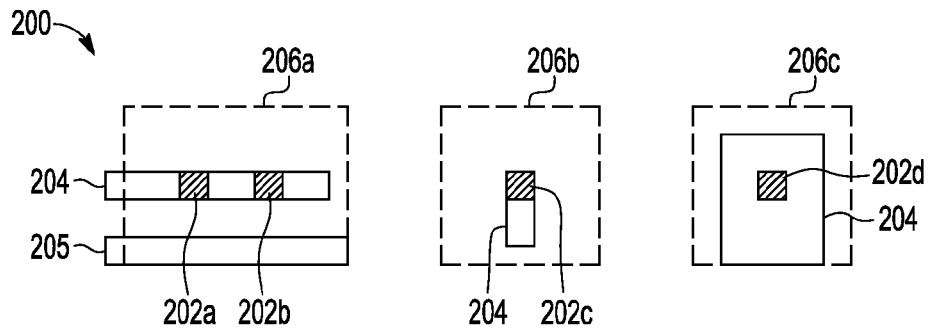
FIG. 2 is a top view of an embodiment of a partial layout of a semiconductor device during a first stage of design.

With reference with FIGS. 1 and 2, FIG. 2 is a top view of an embodiment of a partial layout of semiconductor device 200 at a first stage of design. Semiconductor device 200 includes a plurality of vias 202a, 202b, 202c, and 202d (collectively, "vias 202"), metal lines 204 coupled to the vias 202, and metal line 205 which is adjacent to vias 202a and 202b. Metal lines 204 and 205 may be referred to as covering metal because they are located over vias 202. That is, vias 202 are coupled between covering metal, such as metal lines 204, and landing metal, located below vias 202. Metal line 205 is formed in the same layer as metal lines 204, even though there may be no via coupled to it, and is therefore still referred to as part of the covering metal with respect to vias 202. Note that the covering metal may correspond to the last metal layer of semiconductor device 200. Using the database generated in process 102, process 104 includes creating or determining zones 206a, 206b, 206c (collectively, "zones 206") around vias 202 within a predetermined distance around vias 202.

In the example shown, zone 206a is a polygon shape around vias 202a, 202b; zone 206b is a polygon shape around via 202c; and zone 206c is a polygon around via 202d. Although zones 206 are shown as polygons, zones 206 can be any suitable shape.

Vias 202 are typically created with approximately the same shape, shown as a square in FIG. 2. In some implementations, zones 206 can be determined by upsizing the original size of vias 202 by a suitable distance. The particular upsize distance to determine zones 206 can be based on the size of the components of the semiconductor device 200. Semiconductor processing technology is often referred to based on the drawn transistor minimum gate length. For example, the term 90 nm technology refers to a silicon technology with a drawn transistor minimum gate length of 90-100 nm. As a further example, vias 202 in a 90 mm technology semiconductor device 200 can be 0.13 micron per side and the upsize distance can be 0.9 microns per side to form polygons that are 1.93 microns per side.

In an alternate embodiment, zones 206 may be formed may be defined which are no greater than 10 times, or no greater than 12 times, the minimum line pitch for the processing technology used for semiconductor device 200. As used herein, pitch is the distance between centers of metal lines adjacent to each other. Note that other suitable via sizes and shapes, and upsize distances for forming zones 206 can be used. For example, in one embodiment, zones 206 are no larger than an order of magnitude of twice the minimum metal feature size for the semiconductor device. Other techniques for creating zones 206 around vias 202 can also be used.

Process 104 can further include presenting an image of zones 206 on semiconductor device 200 to the user of the design system via a display device. Process 104 can also interactively allow a user to add, delete, and/or resize tile zones 206 manually, if desired.

Zones 206 that overlap or touch one another can be combined into one zone. For example, larger zones 206a was formed by combining individual zones (not shown) around respective vias 202a/202b because the individual zone around vias 202a/202b overlapped or touched one another.

Process 106 includes measuring or determining the density of covering metal in each zone 202. For example, for zone 202a, the portions of metal lines 204 and 205 within zone 202a are used to determine the covering metal density. For zone 206b, the portion of metal line 204 within zone 206b is used to determine the covering metal density. For zone 206c, the portion of metal line 204 within zone 206c is used to determine the covering metal density.

Figure 3:
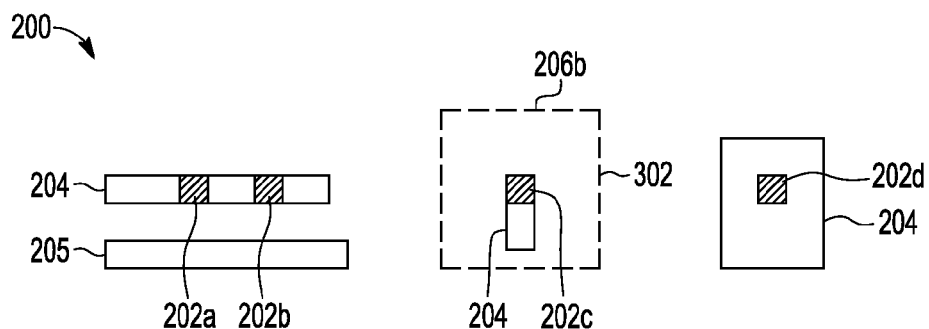
FIG. 3 is a top view of the semiconductor device of FIG. 2 during a subsequent stage of design.

Referring back to FIG. 1, process 108 includes selecting zones which have a density less than a predetermined density threshold. In one embodiment, the predetermined density threshold may be 80%, such that any zone 202 having a density less than 80% is selected. Alternatively, the predetermined density threshold may be 70%, 60%, 50%, 40%, 30%, 20%, 15%, 10%, or 5%. In the embodiments herein, it will be assumed that the predetermined density threshold is 30% such that any zone 202 having a density of covering metal less than 30% is selected by process 108. Referring to FIG. 3, FIG. 3 is a top view of semiconductor device 200 of FIG. 2 after a subsequent stage of design including processor 108, in which zone 206b is selected. In the illustrated example, zone 206b has a covering metal density of less than 30% while each of zones 206a and 206b have a covering metal density of greater than 30%. Process 108 can also include showing selected and unselected vias 202 to the user of the design system via display device. In one embodiment, process 108 may highlight those zones which are selected. Selection of zone 202b can be performed in logic instructions executed by a computer processor and therefore may not otherwise be visible to a user. Process 108 can also interactively allow a user to select and deselect vias manually, however, given the large number of vias that may be included in a semiconductor device, manual selection is generally not performed.

Referring to FIG. 3, selected zones 202, such as zone 206b, can be referred to as tiling zones 302 in which tiles will be added. In this case, tiling zone 302 is the same zone as selected zones 202 (such as zone 202b). In an alternate embodiment, once a zone is selected, it may be resized for tiling. For example, tiling zone 302 (in which tiles will be added) may be larger or smaller than the zone used for the determination of covering metal density (zone 206). Furthermore, the shape of the tiling zone may also be changed. In one embodiment, an image of selected zone 302 on semiconductor device 200 may be presented to the user of the design system via a display device. The design system can also interactively allow a user to add, delete, and/or resize tiling zones 302 manually, if desired.

Figure 4:
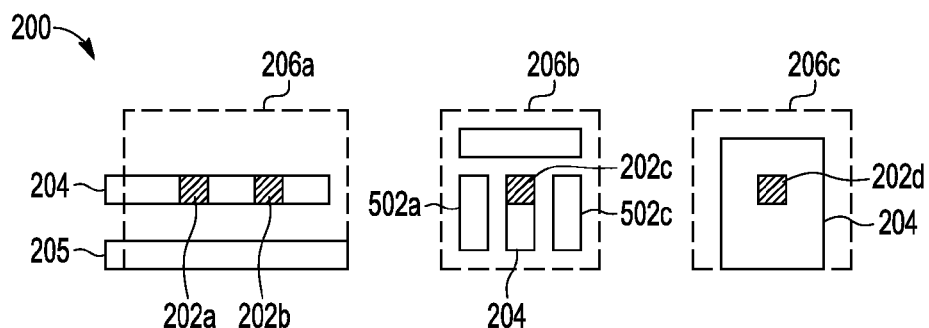
FIG. 4 is a top view of the semiconductor device of FIG. 3 during a subsequent stage of design.

Referring to FIGS. 1 and 4, FIG. 4 is a top view of semiconductor device 200 of FIG. 3 after a subsequent stage of design including process 112 in which tiling features 502a, 502b, 502c (collectively, "tiling features 502") are metal tiling features inlaid in a dielectric layer above that in which via(s) 202 are formed and within tiling zone 302 (e.g. corresponding to selected zone 206b). Tiling features 502 are therefore added to the metal layer above the plurality of via(s) 202. Tiling features 502 are used to form a pattern for creating trenches around via 202 within tiling zone 302. The trenches allow out-gassing of more oxygen sources that can cause delamination and high via resistance than would be possible without the trenches. Further, since metal features are typically formed between dielectric layers to form interconnects with vias 202 between metal layers, no extra processing steps or time is required to include additional tiling features 502.

Any suitable technique or criteria can be used to determine the size, shape, position, and orientation of tiling features 502. For example, tiling features 502 may be configured to obtain a metal density that is greater than or equal to the predetermined density threshold described in reference to process 108. Therefore, if zones 206 are redrawn for vias 202 of semiconductor device 200 at the processing stage of FIG. 4, as was done in the processing stage of FIG. 2, the density of covering metal in each of zones 206 is now greater than or equal to the predetermined density threshold. In one embodiment, the resulting metal density is greater than about 5 percent. In one embodiment, the resulting metal coverage in each of zones 206 after adding tiling features 502 is no less than 5 percent, or no less than 3 percent, of surface area within the zone. Also, in one embodiment, dimensions of polygons used to pattern trenches for metallization around via 202 are selected such that tiling features 502 are capable of fitting into an existing layout and meet a density goal of greater than 20% in the zone.

Tiling features 502 may be oriented along x and y directions, or at an angle. The size and shape of tiling features 502 may be selected based on the capabilities and minimum feature size of the equipment being used to manufacture semiconductor device 200. An example for configuring tiling features 502 for 90 mm technology can include tiling features 502 that have a height of 0.14 um, and vary in width from 0.5 um to 0.8 um in increments of 0.1 um. These added tiling features 502 are added in accordance with the design rules governing the allowed spacing to other features in the design such as metal interconnects, other tiles, and other restricted areas.

Figure 5:
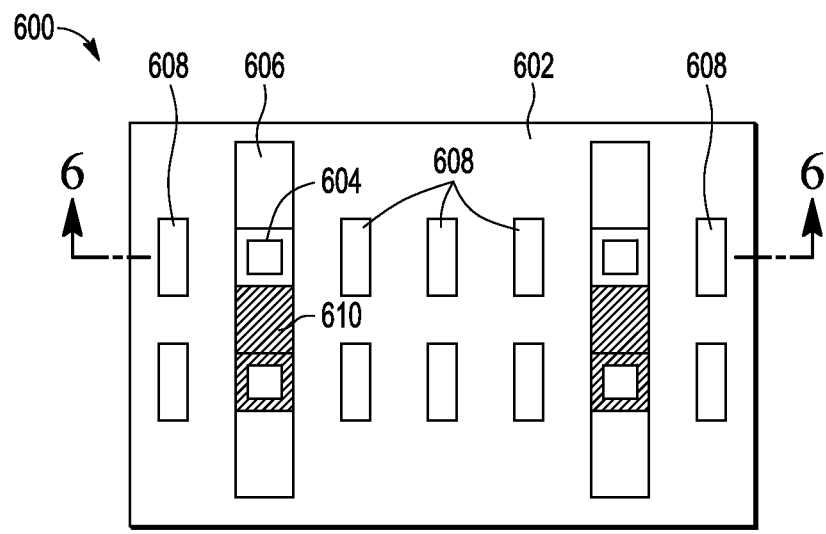
FIG. 5 is a top view of an embodiment of a semiconductor device.
Figure 6:
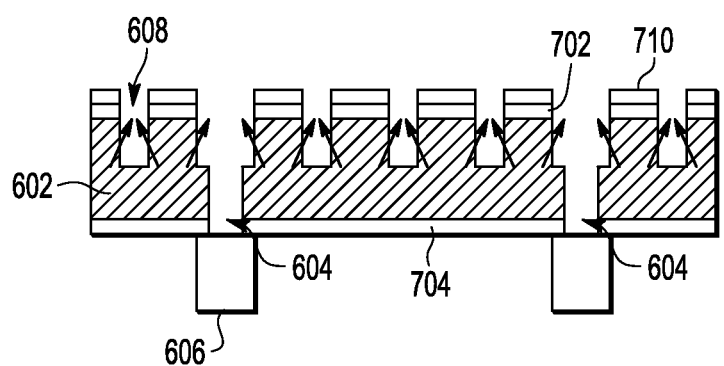
FIG. 6 is a cross-section view of the semiconductor device of FIG. 5.

Referring to FIGS. 5 and 6, FIG. 5 is a top view of an embodiment of a portion of a semiconductor device 600 including lower dielectric layer 602, a plurality of vias 604, lower level metal lines 606 (i.e. landing metal), tiling features 608, and upper level metal lines 610 (i.e. covering metal). FIG. 6 is a cross-section view of semiconductor device 600 of FIG. 5 that shows lower dielectric layer 602, a plurality of vias 604, lower level metal lines 606 (i.e. landing metal 606), tiling features 608 in dielectric layer 602, upper dielectric layer 702, etch stop layer 704, and anti-reflective layer 710. The portion of semiconductor device 600 may be built on an insulating layer formed on a semiconductor substrate (not shown). Also, tiling features 608 may correspond to tiling features 502 described above.

As an example, metal lines 606, 610 may be formed of copper or other suitable conductive material. Etch stop layer 704 may be formed of silicon carbon nitride (SiCN) having a thickness ranging from 200-600 Angstroms. Dielectric layer 602 may be formed of SiCOH with a thickness ranging from 4000 to 6000 Angstroms. Dielectric layer 702 may be formed of tetra-ethoxy-silane (TEOS) having a thickness ranging from 700-1300 Angstroms. Anti-reflective layer 710 may be formed of silicon rich silicon nitride (SRN) having a thickness ranging from 400 to 700 Angstroms, or silicon rich silicon oxynitride (SRON) having a thickness ranging from 250 to 500 Angstroms. Other suitable thicknesses and materials may be used, however.

Interconnect delay is a major limiting factor in the effort to improve the speed and performance of integrated circuits (ICs). One way to minimize interconnect delay is to reduce interconnect capacitance by using low-k materials during production of the ICs. Such low-k materials have also proven useful for low temperature processing. Low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k materials.

Accordingly, dielectric layer 602 can, for example, contain SiCOH, which is a low-k dielectric material. Low-k dielectric materials have a nominal dielectric constant less than the dielectric constant of SiO2, which is approximately 4 (e.g., the dielectric constant for thermally grown silicon dioxide can range from 3.8 to 3.9). High-k materials have a nominal dielectric constant greater than the dielectric constant of SiO2. Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material.

Examples of two materials found suitable for low-K dielectrics are PECVD SiCOH dielectrics formed with either TMCTS (or OMCTS precursors). A precursor is a material which contains the SiCOH molecules in a larger carrier molecule which flows in a plasma chemical vapor deposition system for depositing the dielectric film. These films have many desirable characteristics but, as deposited, have residual OH (hydroxyl), and H2O (water) which require out-gassing. Out-gassing is a process during which semiconductor device 600 is heated at a specified temperature for a specified duration of time to allow the moisture in low-K dielectric layer 602 to dissipate.

Dielectric layer 702 may also provide a waterproof barrier that prevents moisture from seeping into as well as out of dielectric layer 602. If dielectric layer 702 is formed before substantially all of the moisture is out-gassed from dielectric layer 602, residual oxygen sources could react with metal in vias 202 and layers 606, 610 to form oxides that causes delamination between metal layers 606, 610 and dielectric layers 602, 702, as well as create high via resistance. Areas with higher via density provide more exposed surface area of dielectric layer 602 through which moisture can evaporate. Moisture can be trapped in areas with low via density however. Accordingly, placing tiling features 608 (which may correspond to tiling features 502 described above) around isolated vias 604 allows greater dissipation of residual oxygen (e.g., OH (hydroxyl) and H2O (water)) in dielectric layer 602 during out-gassing process steps prior to metal forming steps as semiconductor device 600 is manufactured.

By now it should be appreciated that there has been provided a semiconductor device having improved via reliability. Therefore, by identifying zones around vias in which the density of the covering metal is less than a predetermined density threshold, tiling features can be added in these identified zones in order to increase the density of the covering metal. In this manner, moisture dissipation during out-gassing processes may be reduced.

Process 100 can be performed by executing program logic instructions on a general purpose computer, such as a workstation coupled to a mainframe computer, and/or a desktop, laptop, tablet, or notebook computer. The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Furthermore, those skilled in the art will recognize that boundaries between the functionality of the above described processes and methods are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the disclosure is described herein with reference to specific embodiments, various modifications and changes can be made without departing from the scope of the present disclosure as set forth in the claims below. For example, the structure was described as adding a conductive line under the dangling via, the described approach is also applicable to the situation in which the added conductive line over the dangling via. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for tiling selected vias in a semiconductor device having a plurality of vias, and the method includes generating a layout database for the semiconductor device; creating zones around the plurality of vias; measuring density of covering metal in each zone; selecting a low density zone as being a zone that has a metal density less than a threshold metal density; and adding at least one tiling feature on a metal layer above the plurality of vias in the low density zone so that metal density of the low density zone increases to at least the same as the threshold metal density. Item 2 includes the method of item 1, wherein identifying low density zones further includes creating the zones by upsizing the plurality of vias. Item 3 includes the method of item 1, wherein adding tiling features on a metal layer, further comprises the metal layer being an inlaid metal layer. Item 4 includes the method of item 1, wherein the creating zones includes upsizing the vias a predetermined amount based on an original size of the vias. Item 5 includes the method of item 1, wherein creating zones includes defining the zones to have a dimension no larger than an order of magnitude of twice the minimum metal feature size for the semiconductor device. Item 6 includes the method of item 1, wherein adding the tiling feature further includes adding tiling features to obtain a metal coverage of no less than 3 percent of surface area within the zone. Item 7 includes the method of item 1, wherein the method is performed for interlevel dielectric layers of the semiconductor device comprising a low-k oxide. Item 8 includes the method of item 1, wherein creating the zones around the vias further includes upsizing the vias by 0.9 microns per side.

Item 9 includes method for tiling selected vias in a semiconductor device having a plurality of vias, and the method includes generating a layout database for the semiconductor device; creating a plurality of zones by upsizing the plurality of vias; disregarding zones of the plurality of zones that have more than a threshold metal density as being not low density zones; selecting zones in remaining zones as being low density zones; and adding at least one tiling feature on a metal layer in each of the low density zones. Item 10 includes the method of item 9 wherein creating the plurality of zones further includes defining the zones as being no larger than an order of magnitude of twice the minimum metal feature size for the semiconductor device. Item 11 includes the method of item 9 and further includes selecting dimensions of polygons used to pattern trenches for metallization such that the at least one tiling feature is capable of fitting into an existing layout and meet a density goal of greater than 20% in the remaining zones. Item 12 includes the method of item 9, wherein creating the plurality of zones further includes sizing the zones to be no greater than twelve times a minimum pitch between metal lines for the semiconductor device. Item 13 includes the method of item 9, wherein adding at least one tiling feature further includes adding tiling features to obtain a metal coverage of no less than five percent of surface area within the remaining zones. Item 14 includes the method of item 9, wherein the method is performed for interlevel dielectric layers of the semiconductor device comprising a low-k oxide.

Item 15 includes a semiconductor device having a first insulating layer; a first metal conductor layer formed over the first insulating layer; a second insulating layer comprising a low-k insulating material formed over the first metal conductor; a second metal conductor layer formed over the second insulating layer; vias formed in the second insulating layer connecting the first metal conductor layer to the second metal conductor layer; and a plurality of trenches, formed in the second insulating layer so that predetermined areas around each of the vias meets a minimum metal density, wherein the plurality of trenches provides moisture venting for the via. Item 16 includes the semiconductor device of item 15, wherein a low-k insulating material is an insulating material having a relative permittivity of less than about 3.9. Item 17 includes the semiconductor device of item 15, wherein the moisture is vented during a heating step of the semiconductor device. Item 18 includes the semiconductor device of item 15, wherein the plurality of trenches further include a metal. Item 19 includes the semiconductor device of item 15, wherein the predetermined areas are no larger than an order of magnitude of twice the minimum metal feature size of the semiconductor device. Item 20 includes the semiconductor device of item 15, wherein metal density within the predetermined areas is greater than about five percent.

What is claimed is:

1. A method for tiling selected vias in a semiconductor device having a plurality of vias, the method comprising:
    generating a layout database for the semiconductor device;
    creating zones around the plurality of vias by upsizing the plurality of vias;
    measuring density of covering metal in each created zone, wherein the covering metal in each created zone is located in a metal layer that is above the plurality of vias;
    selecting a low density zone as being a zone of the created zones that has a covering metal density less than a threshold metal density; and
    adding at least one tiling feature on the metal layer above the plurality of vias in the low density zone so that the covering metal density of the low density zone increases to at least the same as the threshold metal density.

2. The method of claim 1, wherein creating the zones comprises:
    creating the zones by upsizing the plurality of vias.

3. The method of claim 1, wherein adding tiling features on the metal layer, further comprises the metal layer being an inlaid metal layer.

4. The method of claim 1, wherein the creating zones comprises upsizing the vias a predetermined amount based on an original size of the vias.

5. The method of claim 1, wherein creating zones comprises defining the zones to have a dimension no larger than an order of magnitude of twice the minimum metal feature size for the semiconductor device.

6. The method of claim 1, wherein adding the tiling feature further comprises adding tiling features to obtain a metal coverage of no less than 3 percent of surface area within the zone.

7. The method of claim 1, wherein the method is performed for interlevel dielectric layers of the semiconductor device comprising a low-k oxide.

8. The method of claim 1, wherein creating the zones around the vias further comprises upsizing the vias by 0.9 microns per side.

9. A method for tiling selected vias in a semiconductor device having a plurality of vias, the method comprising:
    generating a layout database for the semiconductor device;
    creating a plurality of zones by upsizing the plurality of vias;

disregarding zones of the plurality of zones that have more than a threshold metal density of covering metal as being not low density zones, wherein the covering metal is located in a metal layer located above the plurality of vias;

selecting zones in remaining zones of the plurality of zones as being low density zones; and adding at least one tiling feature on the metal layer in each of the low density zones.

10. The method of claim 9 wherein creating the plurality of zones further comprises defining the zones as being no larger than an order of magnitude of twice the minimum metal feature size for the semiconductor device.

11. The method of claim 9, further comprising selecting dimensions of polygons used to pattern trenches for metallization such that the at least one tiling feature is capable of fitting into an existing layout and meet a density goal of greater than 20% in the remaining zones.

12. The method of claim 9, wherein creating the plurality of zones further comprises sizing the zones to be no greater than twelve times a minimum pitch between metal lines for the semiconductor device.

13. The method of claim 9, wherein adding at least one tiling feature further comprises adding tiling features to obtain a metal coverage of no less than five percent of surface area within the remaining zones.

14. The method of claim 9, wherein the method is performed for interlevel dielectric layers of the semiconductor device comprising a low-k oxide.

\* \* \* \* \*